United States Patent [19]

Vendelin et al.

[11] Patent Number: 4,631,493
[45] Date of Patent: Dec. 23, 1986

[54] CIRCUIT FOR DC BIASING

[75] Inventors: George D. Vendelin, Saratoga; Behruz Rezvani, Cupertino, both of Calif.

[73] Assignee: Eaton Corporation, Cleveland, Ohio

[21] Appl. No.: 712,879

[22] Filed: Mar. 18, 1985

[51] Int. Cl.⁴ .................. H03F 3/193; H03F 3/60; H03F 3/68
[52] U.S. Cl. ........................... 330/277; 330/54; 330/286; 330/295; 330/296; 330/297; 330/310; 331/116 M
[58] Field of Search ............... 330/71, 296, 297, 310, 330/54, 286, 277, 295; 331/96, 116 R, 116 M, 116 FE

[56] References Cited

U.S. PATENT DOCUMENTS 4,496,909  1/1985  Knapp .................. 330/277

FOREIGN PATENT DOCUMENTS

| 652137 | 11/1962 | Canada | 330/297 |
| 1240131 | 5/1967 | Fed. Rep. of Germany | 330/297 |
| 1277356 | 9/1968 | Fed. Rep. of Germany | 330/297 |
| 1238817 | 7/1960 | France | 330/273 |

OTHER PUBLICATIONS

Aalto et al., "Automatic Circuitry for Squid Systems", *Journal of Physics E*, vol. 9, No. 12, Dec. 1976, pp. 1123-1128.

Vavken et al., "High Voltage Operation of Power GaAs FET Amplifiers", Conference: Proceedings of the 10th European Microwave Conference, Warsaw, Poland, 8-12 Sep. 1980, pp. 621-624.

*Primary Examiner*—James B. Mullins
*Attorney, Agent, or Firm*—Thomas E. Schatzel

[57] ABSTRACT

The present invention includes an apparatus and a method for connecting at least a pair of stages in DC series between a pair of power-supply potentials so as to provide economical utilization of the power supply. The stages are connected so as to maintain their AC independence.

7 Claims, 6 Drawing Figures

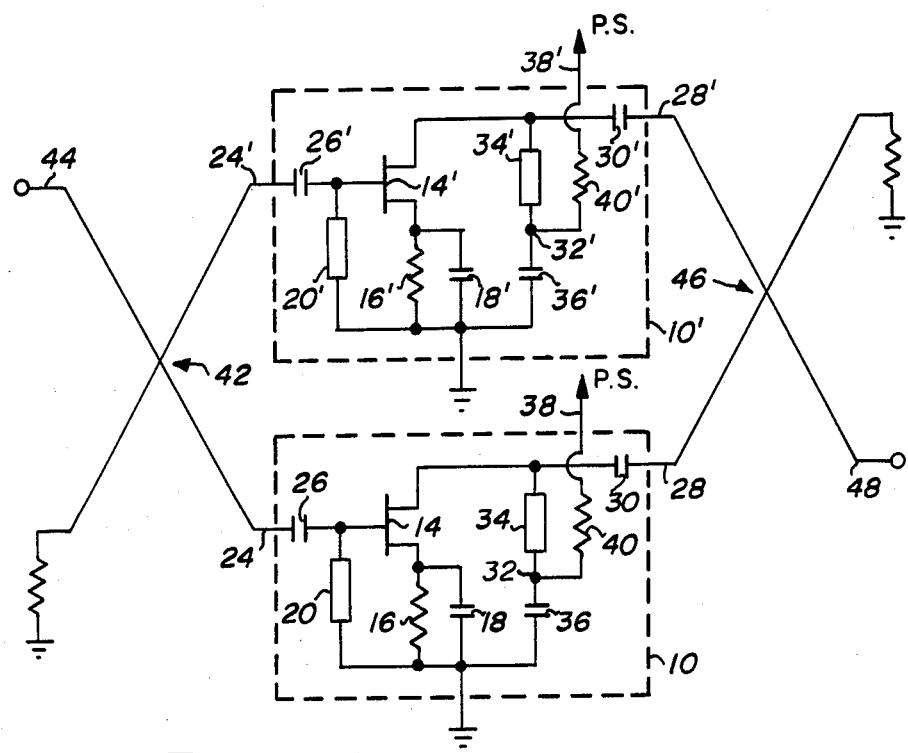
Fig_1 (PRIOR ART)
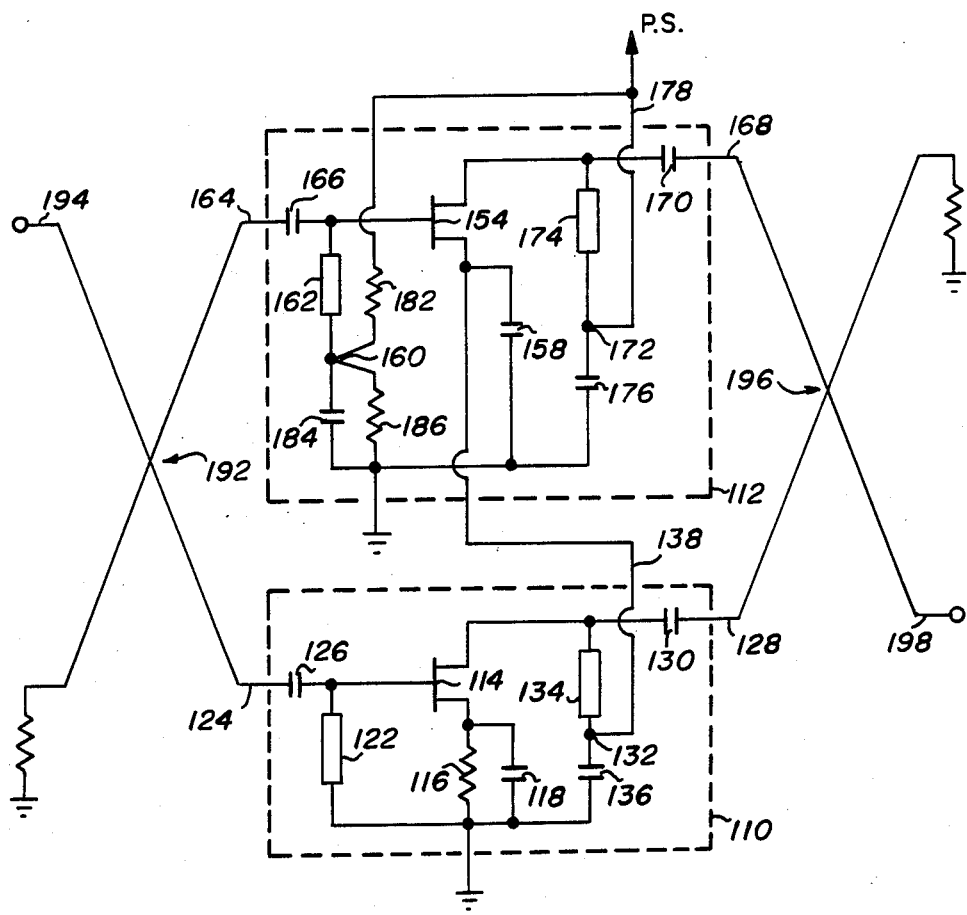
Fig_2

CIRCUIT FOR DC BIASING

BACKGROUND OF THE INVENTION

1. Field of the Invention

The present invention relates to microwave stages generally and more specifically to a combination thereof, combined for more economical power supply utilization.

2. Description of the Prior Art

Heretofore, it has been relatively difficult to make the most economical utilization of many power supplies. Consider, for example, the prior-art-type (microwave) amplifier stage which is illustrated in (the lower portion of) FIG. 1 of the drawing generally designated by the number 10. Stage 10 includes a field-effect transistor (FET), designated 14. Transistor 14 is configured with the transistor source (electrode) coupled to circuit ground (common) both by a source-biasing resistor 16 and by a source-bypassing capacitor 18; the transistor gate (electrode) both coupled to circuit ground by a (microwave, microstrip-line) gate-biasing stub 20 and coupled to a line 24 by a DC-blocking capacitor 26; and the transistor drain (electrode) both coupled to a line 28 by another DC-blocking capacitor 30 and coupled to a node 32 by a drain-biasing stub 34. Node 32 is also coupled to circuit ground by a biasing-stub-bypassing capacitor 36 and coupled to a line 38 by a drain-biasing resistor 40. Line 38 is connected to a positive-power-supply potential which is developed with reference to a negative-power-supply potential which is connected to (common with) circuit ground.

Source-biasing resistor 16 is used to establish the desired, transistor 14, drain-to-source, biasing current. For example, if it were desired to operate transistor 14 with a drain-to-source current of 50 milliamperes, with a gate-to-source potential of −1 volt, a resistor having a resistance of 20 ohms would be used. Drain-biasing resistor 40 is used to drop the excess power-supply potential. For example, if it were desired to operate transistor 14 with a drain-to-source potential drop of 7 volts and if the available power-supply potential were 15 volts, resistor 40 would be used to drop the excess power supply potential of 7 volts. (In this example, one volt is dropped across source-biasing resistor 16.) Thus, with a drain-to-source current of 50 milliamperes, a resistor having a resistance of 140 ohms would be used.

It is no doubt apparent that a considerable portion (47% in this example) of the energy obtained from the power supply is dissipated (wasted) in drain-biasing resistor 40 (7% being dissipated in source-biasing resistor 16). The energy dissipated in resistor 40 (and in resistor 16) represents energy which the power supply must supply and heat which must be removed from the stage. Also, the energy/heat may degrade the reliability of the stage.

Also illustrated in (the upper portion of) FIG. 1 is another type stage 10' which is similar to the stage just discussed (stage 10). (For clarity, similar components are similarly designated; however, numbers designating components in the latter stage (stage 10') each include a prime mark to distinguish the number (component) from the corresponding (similar) number (component in the former stage (stage 10).)

It is important to note that stages 10 and 10' are both DC and AC independent. In other words, the DC operation (the DC biasing currents and DC biasing potentials) of stage 10 are totally independent of that (those) of stage 10', and vice versa, at least to the extent that the power supply impedance may be ignored. Also, the amplification of an AC signal by stage 10 is totally independent of the amplification of an AC signal by stage 10', and vice versa. In other words, stages 10 and 10' may be used each to amplify a respective one of a pair of signals which are similar, which are different in phase or amplitude, or which are totally dissimilar.

For purposes of discussion, stages 10 and 10' are shown connected each to be driven by a respective one of a pair of phase quadrature signals developed by a (microwave, microstripline) 3 db coupler 42 from an input signal 44 and each to drive another 3 db coupler 46 which develops a single output signal on a line 48.

SUMMARY OF THE PRESENT INVENTION

It is therefore an object of the present invention to provide efficient power-supply utilization to reduce DC power requirements, to reduce heat generation and to improve reliability.

Briefly, in accordance with the teachings of the present invention, stages are connected in DC series between a pair of power-supply potentials, the stages being connected so as to maintain their AC independence.

Thus, a material advantage of the present invention is the ability it affords to reduce DC power requirements.

Another advantage of the present invention is the ability it affords to reduce heat generation.

These and other objects and advantages of the present invention will no doubt be obvious to those skilled in the art after having read the detailed description of the presently preferred embodiments illustrated in the several figures of the drawing.

IN THE DRAWING

FIG. 1 is a schematic diagram illustrating a pair of prior-art-type stages;

FIG. 2 is a schematic diagram illustrating a pair of stages connected in accordance with the teachings of the present invention;

DETAILED DESCRIPTION OF THE PREFERRED EMBODIMENTS

Figure 3:
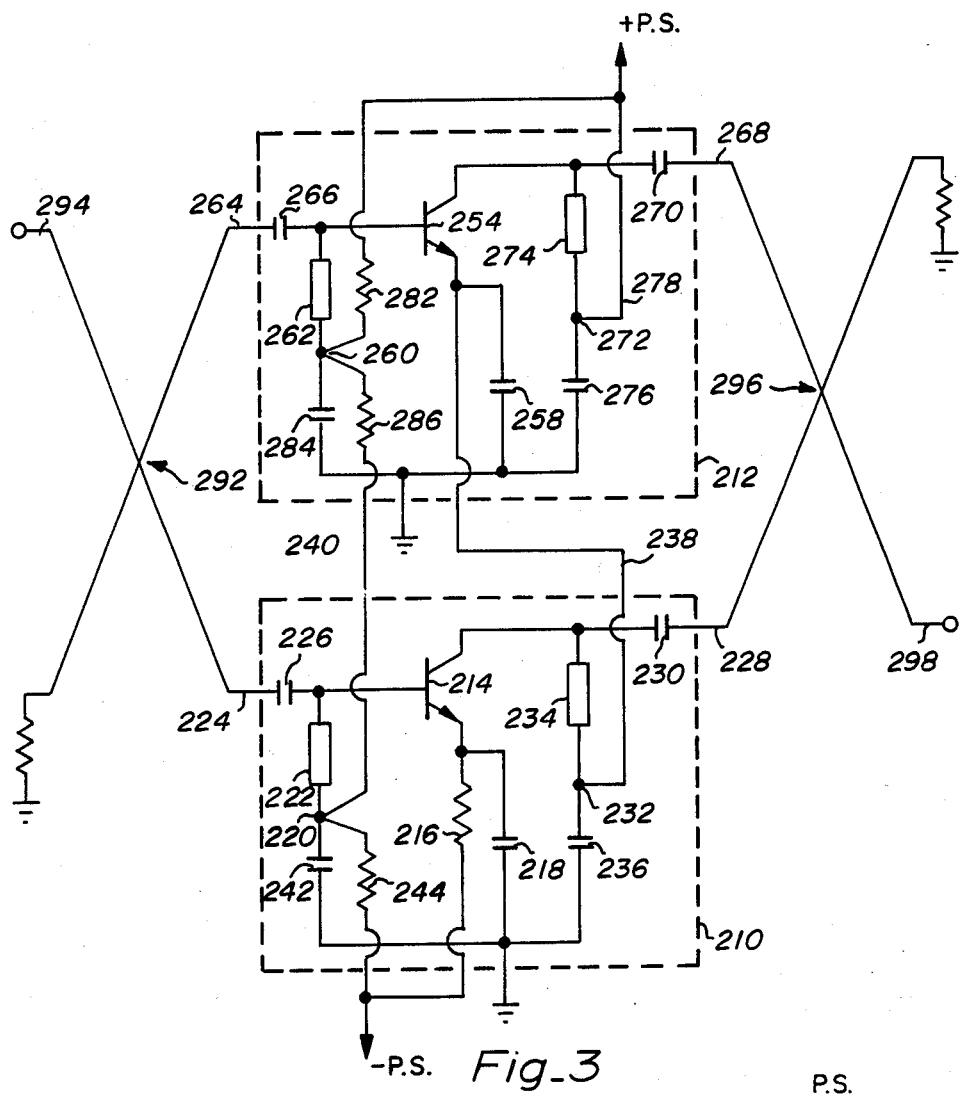
FIG. 3 is a schematic diagram illustrating a pair of bipolar transistor stages connected in accordance with the teachings of the present invention.

Illustrative in FIG. 2 of the drawing (from bottom to top) respectively designated by the numbers 110 and 112 are a pair of (microwave) amplifier stages connected in accordance with the teachings of the present invention. In the presently preferred embodiment, each of stages 110 and 112 includes a gallium arsenide (GaAs) field-effect transistor (FET) of the type which is designated DLX 3501A by the Gould/Dexcel Corporation. The transistor of stage 110, which is designated 114, is configured with the transistor source (electrode)

coupled to circuit ground (common) both by a source-biasing resistor 116 and by a source-bypassing capacitor 118; the transistor gate (electrode) both coupled to circuit ground by a (microwave, microstrip-line) gate-biasing stub 122 and to a line 124 by a DC-blocking capacitor 126; and the transistor drain (electrode) both coupled to a line 128 by another DC-blocking capacitor 130 and coupled to a node 132 by a drain-biasing stub 134. Node 132 is also coupled to circuit ground by a biasing-stub-bypassing capacitor 136 and (directly) connected to a line 138.

The transistor of stage 112, which is designated 154, is configured with the transistor source (directly) connected to line 138 and coupled by another source-bypassing capacitor 158 to circuit ground; the transistor gate both coupled to a node 160 by another gate-biasing stub 162 and to a line 164 by another DC-blocking capacitor 166; and the transistor drain both coupled to a line 168 by still another DC-blocking capacitor 170 and coupled to a node 172 by another drain-biasing stub 174. Node 172 is also coupled to circuit ground by another biasing-stub-bypassing capacitor 176 and (directly) connected to a line 178. In the presently preferred embodiment, line 178 is (directly) connected to a +15 volt, power-supply potential which is developed with reference to a negative-power-supply potential that is connected to (common with) circuit ground. Node 160 is coupled to line 178 by a gate-biasing resistor 182 and coupled to circuit ground both by still another biasing-stub-bypassing capacitor 184 and by another gate-biasing resistor 186.

Source-biasing resistor 116 is used to establish the desired drain-to-source biasing current which flows through both transistors 154 and 114. In the presently preferred embodiment, resistor 116 has a resistance of 20 ohms to establish a transistor drain-to-source current of 50 milliamperes with a transistor 114 gate-to-source potential of −1 volt. Gate-biasing resistors 182 and 186 are used to establish the drain-to-source potential drop of transistor 114. In the presently preferred embodiment, resistors 182 and 186 have a resistance of 8 k ohms and 7 k ohms, respectively, to develop a potential of 7 volts at the gate of transistor 154 to establish a transistor 114, drain-to-source potential drop of 7 volts, with a transistor 154, gate-to-source potential of −1 volt. (One volt is dropped across resistor 116.) In the presently preferred embodiment, a transistor 154, drain-to-source potential drop of 7 volts is established. In this embodiment, 7% of the energy obtained from the power supply is dissipated in source-biasing resistor 116; and, 2% of the energy is dissipated in gate-biasing resistors 182 and 186.

When the desired potential drop developed across the equivalent of source-biasing resistor 116 plus the sum of the desired transistor drain-to-source potential drops is less than the power-supply potential, a drain-biasing resistor is used to couple the equivalent of node 172 to the power-supply potential.

When a "double-ended" power supply is used (one in which the positive-power-supply potential is developed with reference to a negative-power-supply potential which is not connected to circuit ground), the equivalent of gate-biasing stub 122 is connected between the transistor gate and a node which is coupled to yet another, biasing-stub-bypassing capacitor to circuit ground. This latter node is also either directly connected to the negative-power-supply potential or coupled thereto by a third, gate-biasing resistor. Finally, the equivalent of gate-biasing resistor 186 is connected between this latter node and the equivalent of node 160; and, the equivalent of source-biasing resistor 116 is connected between the transistor source and the negative-power-supply potential.

When GaAs MESFETs are used and when "back-gating" (when a DC bias on the transistor channel due to a potential applied to the substrate which acts as a gate electrode) becomes a problem, rather than mounting the transistor on DC, metal, ground, the transistors are mounted, the substrate of each, on a respective chip capacitor which is mounted on DC, metal, ground. EAch transistor substrate is connected to the respective transistor source.

Of course, depending upon the frequencies involved, the biasing stubs may be replaced each with another means for coupling a DC biasing current and/or potential while maintaining AC isolation, such as, for example, an inductor (choke), or, even, a resistor.

It is important to note that although stages 110 and 112 are combined in DC series between a pair of power supply potentials, the AC independence of the stages is maintained. Drain-biasing stub 134, biasing-stub-bypassing capacitor 136, and source-bypassing capacitor 158 prevent any AC interaction.

Although stages 110 and 112 may be driven by a pair of signals which are similar, which differ in phase or amplitude, or which are totally dissimilar, in the presently preferred embodiment, the stages are connected each to be driven by a respective one of a pair of phase quadrature signals developed by a (microwave, microstrip-line) 3 db coupler 192 from an input signal developed on a line 194 and each to drive another 3 db coupler 196 which develops a single output signal on a line 198.

Illustrated in FIG. 3 of the drawing are a pair of stages respectively designated (from bottom to top) 210 and 212, the stages being connected in DC series between the two potentials of a "double-ended" power supply so as to maintain their AC independence. Each of the stages includes a bipolar transistor, preferably of the NEC 567 type. The transistor of stage 210, which is designated 214, is configured with the transistor emitter (electrode) (either directly connected to the negative power-supply potential or) coupled both to the negative-power-supply potential by an emitter-biasing resistor 216 and to circuit ground by an emitter-bypassing capacitor 218; the transistor base (electrode) both coupled to a node 220 by a base-biasing stub 222 and to a line 224 by a DC-blocking capacitor 226; and the transistor collector (electrode) both coupled to a line 228 by another DC-blocking capacitor 230 and coupled to a node 232 by a collector-biasing stub 234. Node 232 is also coupled to circuit ground by another biasing-stub-bypassing capacitor 236 and (directly) connected to a line 238. Node 220 is also connected to a line 240 and coupled both to circuit ground by a biasing-stub-bypassing capacitor 242 and to the negative-power-supply potential by a base-biasing resistor 244. The transistor of stage 212, which is designated 254, is configured with the transistor emitter connected to line 238 and coupled to circuit ground by another emitter-bypassing capacitor 258; the transistor base both coupled to a node 260 by another base-biasing stub 262 and coupled to a line 264 by another DC-blocking capacitor 266; and the transistor collector both coupled to a line 268 by still another DC-blocking capacitor 270 and coupled to a node 272 by another collector-biasing stub 274. Node 272 is also coupled to circuit ground by yet another biasing-stub-bypassing capacitor 276 and connected to the positive power-supply potential by a line 278. Finally, node 260 is also coupled to the positive-power-supply by another base-biasing resistor 282, coupled to circuit ground by another biasing-stub-bypassing capacitor 284, and coupled to line 240 by a third base-biasing resistor 286.

Base-biasing resistors 244, 282, and 286 establish the potential at the base of transistor 214 with respect to the negative-power-supply potential, establishing the potential drop developed across emitter-biasing resistor 216. Emitter-biasing resistor 216 establishes the collector-to-emitter current which flow through both transistors 254 and 214. Base-biasing resistors 244, 282, and 286 also establish the potential at the base of transistor 254, also with respect to the negative-power-supply potential, establishing the collector-to emitter potential drop developed across transistor 214. When node 272 is directly connected to the positive-power-supply potential (and not coupled thereto by a collector-biasing resistor), the power-supply potential not dropped across emitter-biasing resistor 216 and not dropped between the collector and emitter of transistor 214 is dropped between the collector and emitter of transistor 254. Collector-biasing stub 234, biasing-stub-bypassing capacitor 236, and emitter-bypassing capacitor 258 maintain the AC independence of stages 210 and 212.

Preferably, stages 210 and 212 are connected each to be driven by a respective one of a pair of signals developed by a coupler 292 from an input signal developed on a line 294 and each to drive another coupler 296 which develops a signal on a line 298.

Figure 4:
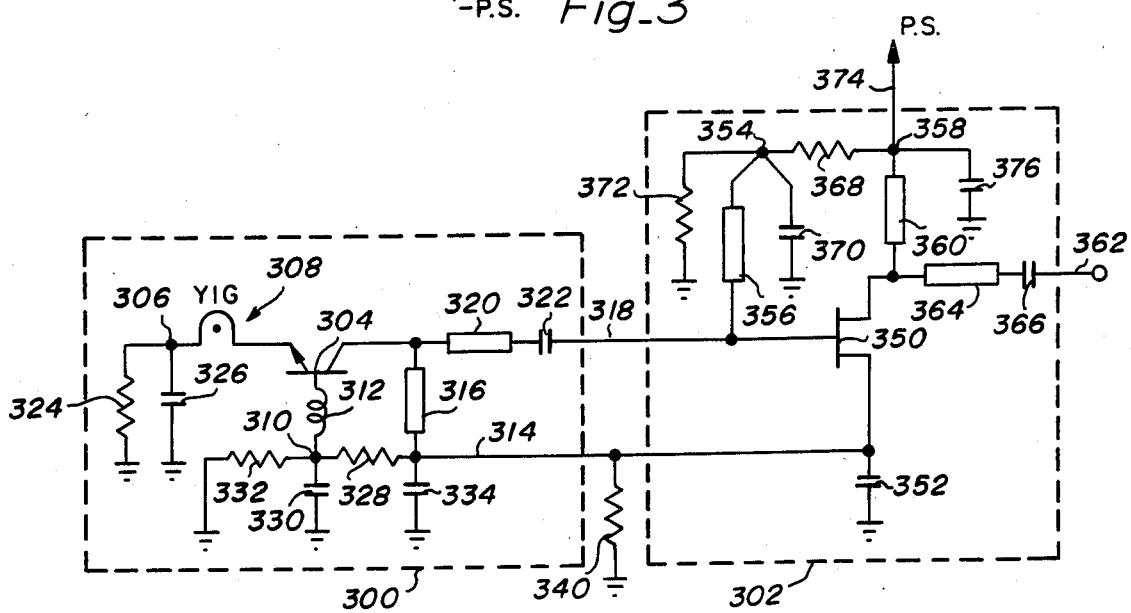
FIG. 4 is a schematic diagram illustrating an oscillator stage and a buffer stage connected in accordance with the teachings of the present invention.

A (microwave) oscillator stage 300 and a buffer (amplifier) stage 302 are illustrated in FIG. 4 connected in accordance with the teachings of the present invention. Preferably, stage 300 includes a transistor 304 which is of the NEC 567 type. Transistor 304 is configured with the transistor emitter coupled to a node 306 by a YIG resonantor 308, the transistor base coupled to a node 310 by a feedback inductor 312; and the transistor collector both coupled to a line 314 by a collector-biasing stub 316 and coupled to a line 318 by the series combination of a (microwave, microstrip-line) impedance-matching line 320 and a DC-blocking capacitor 322. Node 306 is also coupled to circuit ground both by an emitter-biasing resistor 324 and by an emitter-bypassing capacitor 326. Node 310 is also coupled to line 314 by a base-biasing resistor 328 and coupled to circuit ground both by a bypassing capacitor 330 and by another base-biasing resistor 332. Connected between line 314 and circuit ground is a biasing-stub-bypassing capacitor 334.

A stage 302 biasing resistor 340 is connected between line 314 and circuit ground. Buffer stage 302 includes a transistor 350 which is of the DXL 3501A type. Transistor 350 is configured with the transistor source connected to a line 314 which is coupled to circuit ground by a source-bypassing capacitor 352; the transistor gate connected to line 318 which is coupled to a node 354 by a gate-biasing stub 356; and the transistor drain both coupled to a node 358 by a drain-biasing stub 360 and coupled to a line 362 by the series combination of an impedance-matching line 364 and a DC-blocking capacitor 366. Node 354 is also coupled to node 358 by a gate-biasing resistor 368 and coupled to circuit ground both by a biasing-stub-bypassing capacitor 370 and by another gate-biasing resistor 372. Node 358 is (directly) connected to a positive-power-supply potential by a line 374 and coupled to circuit ground by another biasing-stub-bypassing capacitor 376.

Base-biasing resistors 328 and 332 establish the potential at the base of transistor 304 establishing the potential drop developed across emitter-biasing resistor 324. Emitter-biasing resistor 324 establishes the collector-to-emitter current which flows through transistor 304. The current which flows through transistor 304 and resistor 324 forms a portion of the drain-to-source current which flows through transistor 350. The rest of the transistor 350, drain-to-source current is established by stage 302, biasing resistor 340. The transistor 304 collector-to-emitter potential drop is established by gate-biasing resistors 368 and 372.

Collector-biasing stub 316, biasing-stub-bypassing capacitor 334, and source-bypassing capacitor 352 AC-isolate stages 300 and 302. Line 318 provides an AC-connection between stages 300 and 302 whereby the signal generated by oscillator stage 300 drives buffer stage 302.

Figure 5:
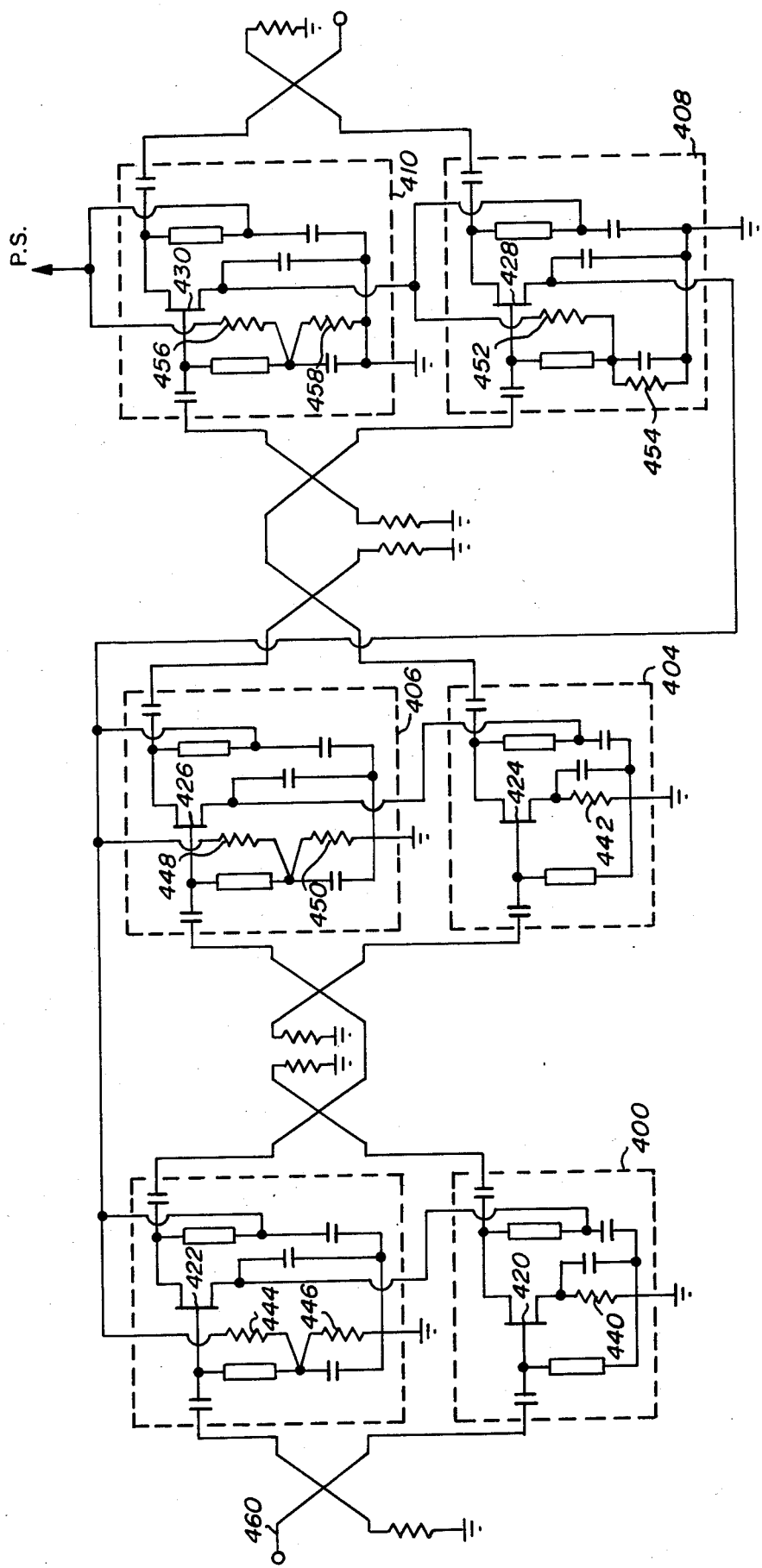
FIG. 5 is a schematic diagram illustrating six stages connected in accordance with the teachings of the present invention.

Illustrated in FIG. 5 of the drawing are six stages connected in accordance with the teachings of the present invention. The stages, which are respectively designated 400, 402, 404, 406, 408, and 410 each include a respective one of six transistors which are designated 420, 422, 424, 426, 428, and 430. Stages 400 and 404 each include a source-biasing resistor, respectively designated 440 and 442; and, stages 402, 406, 408, and 410 each include a pair of gate-biasing resistors respectively designated 444 and 446, 448 and 450, 452 and 454, and 456 and 458. Source-biasing resistor 440 establishes the drain-to-source current which flows through transistors 422 and 420, the current forming a portion of the current which flows through transistors 430 and 428. The rest of the drain-to-source current which flows through transistors 430 and 428 flows through transistors 426 and 424, the current being established by source-biasing resistor 442. Gate-biasing resistors 444 and 446 establish the transistor 420 drain-to-source potential drop; and, gate-biasing resistors 448 and 450 establish the transistor 424 drain-to-source potential drop. Gate-biasing resistors 452 and 454 establish the drain-to-source potential drop developed across each of transistors 422 and 426; and, gate-biasing resistors 456 and 458 establish the transistor 428 drain-to-source potential drop. The remainder of the power-supply potential not dropped across source-biasing resistors 440 and 442 or the other transistors is dropped between the drain and source of transistor 430.

The stages are AC connected in three groups of two to provide successive amplification of a signal developed on a line 460. Fir this purpose, the stages are DC-biased to provide higher biasing current for each successive group of stages.

Figure 6:
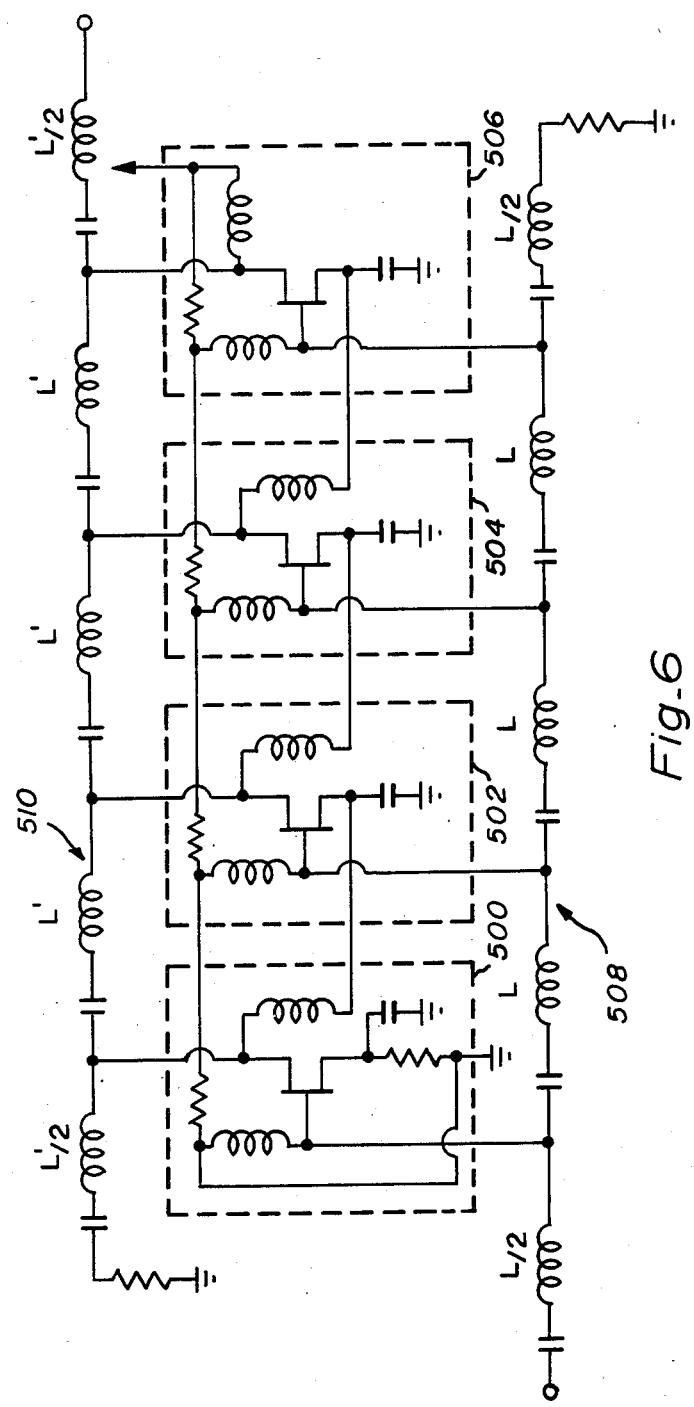
FIG. 6 is a schematic diagram illustrating a number of stages connected in accordance with the teachings of the present invention, the stages forming a distributed amplifier.

Illustrative in FIG. 6 of the drawing are four stages which are connected in series between a pair of power supply potentials (one of which is connected to circuit ground). The stages, which are respectively designated 500, 502, 504, and 506 are connected to form a distributed amplifier. More specifically, the stages are each AC connected to amplify the signal developed at a respective one of four taps of an input transmission line 508 to develop a signal at a respective one of four taps of another, output transmission line 510, which propagates the amplified output signal.

After having read the preceding disclosure, certain alterations and modifications of the present invention will no doubt become apparent to those skilled in the art. It is therefore intended that the following claims be interpreted to cover all such alterations and modifications as fall within the true spirit and scope of the invention.

I claim:

1. The combination comprising:
    a first stage for connection to at least one of a pair of power-supply potentials; and
    a second stage for connection to at least the other one of said pair of power-supply potentials, said second stage including,
        a field-effect transistor having a drain, a source, and a gate,
        means for coupling said drain of said second-stage transistor to said other one of said pair of power-supply potentials,
        means for DC coupling said source of said second-stage transistor to said first stage and for AC decoupling said source of said second-stage transistor from said first stage, and
        means for biasing said gate of said second-stage transistor at a predetermined DC potential which is independent of the level of the DC current which flows through said second-stage transistor establishing the DC potential developed at said source of said second-stage transistor.

2. The combination as recited in claim 1 wherein said second stage DC coupling and AC decoupling means has a bypassing capacitor connected between said source of said second-stage transistor and circuit ground.

3. The combination as recited in claim 1 wherein said DC coupling and AC decoupling means has a line connecting said source of said second-stage transistor to said first stage.

4. The combination as recited in claim 3 wherein said second stage DC coupling and AC decoupling means has a bypassing capacitor connected between said source of said second-stage transistor and circuit ground.

5. The combination as recited in claim 1 wherein said first stage includes:
    a field-effect transistor having a gate, a drain, and a source;
    means for biasing said gate of said first-stage transistor at a predetermined DC potential;
    means for coupling said drain of said first-stage transistor to said second stage; and
    source-biasing means for establishing the DC current which flows through said first-stage transistor, said current forming at least a predetermined portion of the DC current which flows through said second stage.

6. The combination as recited in claim 5 wherein said first-stage source-biasing means has a resistor connected to said source of said first-stage transistor and for connection to said one of said pair of power-supply potentials.

7. The combination as recited in claim 6 wherein said first stage further includes a bypassing capacitor connected between said source of said first-stage transistor and circuit ground.

* * * * *